United States Patent [19]

Lau

[11] Patent Number: 4,744,847

[45] Date of Patent: May 17, 1988

[54] FILM TRIMMING OF LAMINATED PHOTOSENSITIVE LAYER

[75] Inventor: Tit-Keung Lau, Wilmington, Del.

[73] Assignee: E. I. Du Pont de Nemours and Company, Wilmington, Del.

[21] Appl. No.: 823,529

[22] Filed: Jan. 29, 1986

[51] Int. Cl.$^4$ .................. B32B 31/00; B44C 1/00; G03C 1/90

[52] U.S. Cl. .................. 156/238; 156/247; 156/250; 430/270

[58] Field of Search .............. 156/230, 234, 236, 240, 156/344, 247, 248, 249, 238, 241, 270, 540, 250; 430/220, 282

[56] References Cited

U.S. PATENT DOCUMENTS 4,075,051  2/1978  Brzozowski ............... 156/236
4,378,264  3/1983  Pilette et al. .............. 156/238
4,495,014  1/1985  Gebrian et al. ............ 156/234

*Primary Examiner*—Donald E. Czaja
*Assistant Examiner*—Louis Falasco

[57] ABSTRACT

A process is disclosed for separating a series of substrate elements laminated with a supported photosensitive composition whereby the support is weakened by heating in a line pattern along abutting edges of the substrate prior to pulling the laminated substrates apart.

6 Claims, No Drawings

FILM TRIMMING OF LAMINATED PHOTOSENSITIVE LAYER

BACKGROUND OF THE INVENTION

The present invention relates to a process for laminating a continuous layer of a photosensitive material which contains a support film to a series of substrates and trimming, i.e., breaking, the photosensitive layer and the support film at the laminated edges of the sbustrates. The support film serves as a backing material for the photosensitive layer and a severing operation is required to separate the laminated substrates from one another.

U.S. Pat. No. 4,378,264 discloses an integrated process for laminating a supported photosensitive composition onto a series of substrates wherein after lamination a laminated substrate is pulled or jerked along its longitudinal axis in the direction of travel of the substrate to exceed the breaking strength of the laminated layer and the support (if present) at the trailing edge of the substrate.

U.S. Pat. No. 4,075,051 discloses a process of laminating a photosensitive film to a substrate, applying a solvent or softening agent to a portion of a backup sheet contacting the photosensitive film to reduce the tear strength of the film, and peeling the backup sheet from the laminated photoresist film whereby the weakened photoresist is torn along the edge of the substrate.

SUMMARY OF THE INVENTION

The invention is directed to a process for laminating a layer of a photosensitive composition which is supported by a strippable polymeric film to at least two substrate elements and separating the photosensitive layer and the polymeric film along an edge of each substrate element comprising the steps of:

(a) advancing two substrate elements to a laminating position;

(b) laminating a layer of a photosensitive composition supported by a strippable polymeric film onto a first substrate element and continuing the lamination onto a second substrate element whereby the substrate elements abut or substantially abut one another;

(c) heating a localized area of the strippable film in a line pattern adjacent an edge of each of the substrate elements which abut or substantially abut one another whereby the heating serves to weaken the strippable polymeric film along the line pattern without substantially adversely affecting the photosensitive composition;

(d) pulling on the first substrate element along its longitudinal axis in a direction of advancement of the substrate element to exceed the breaking strength of both the laminated photosensitive layer and the weakened polymeric film to separate the first and second substrate elements.

DETAILED DESCRIPTION OF THE INVENTION

The present invention is an improved process over the method disclosed in Pilette et al. U.S. Pat. No. 4,378,264 incorporated by reference herein for laminating a supported photosensitive composition to a series of substrate elements and trimming the laminated layer, i.e., breaking the layer to allow the substrate elements to be separated from one another. In the lamination procedure this patent lists the steps of:

(1) advancing a continuous layer of photosensitive organic polymeric compositon, the layer being supported on one side by a strippable polymeric film, and a first substrate to the nip of a set of laminating rolls;

(2) contacting the unsupported surface of the supported layer with a surface of the substrate element within the nip under pressure to effect lamination of the layer to the surface of the substrate element;

(3) optionally removing the support film from the layer as the laminated substrate element emerges from the nip of the laminating rolls and continuing advancement of the laminated substrate element until the support layer is completely removed from the laminated layer;

(4) by which pulling on the laminated substrate element along its longitudinal axis in the direction of advancement by which the breaking strength of the laminated layer and, if present, the support film is exceeded at the trailing edge of the substrate transversely to the direction of advancement; and (5) repeating the sequence of steps (2) through (4) with respect to subsequent substrate elements in the series.

Unlike the method of this patent, the present invention requires that the support film is in place at the time of the trimming operation is undertaken and it is not an optional embodiment.

The structure for lamination may be of three ply substrate containing a solid photosensitive composition between a support film and a coversheet such as disclosed in U.S. Pat. No. 3,469,982 with the coversheet removed prior to lamination or a two ply construction such as disclosed in U.S. Pat. No. 4,293,635 which does not employ a coversheet. The solid photosensitive compostion may be negative working including photopolymerizable compositions such as disclosed in the preceding two patents or positive working such as disclosed in U.S. Pat. No. 3,837,860 and U.S. Pat. No. 3,778,270.

A key requirement in the lamination procedure is that the substrate elements abut or substantially abut one another along adjacent edges which are to be separated from one another when the photosensitive compositon and support film are broken. In the present context substantially abut means that the substrate elements will be in close proximity to one another. Generally the edges will be no more than ¼ inch or ⅛ inch from one another. Although less desirable, the edges can be spaced apart as much as one inch although potential problems can quickly arise due to a flap of photosensitive material and support film at an edge portion of separated substrate element. Such flap can interfere with subsequent processing steps, e.g., the photosensitive material from the flap can be redeposited on the laminated portion.

It is a further requirement that the polymeric support film comprises a material which is weakened by application of heat.

The materials of construction for the support film are well known in the prior art. A suitable strippable support which preferably has a high degree of dimensional stability to temperature changes, may be chosen from a wide variety of films composed of high polymer, e.g., polyamides, polyolefins, polyesters, vinyl polymers, and cellulose esters, and may be of varying thickness such a from 0.00025 inch (~0.0006 cm) to 0.008 inch (~0.02 cm) or more. A particularly suitable support is a transparent polyethylene terephthalate film. The thickness of the support film is not critical except that higher pull forces or a greater degree of heating is necessary to break or weaken a thicker film.

After the lamination procedure wherein the photosensitive composition, e.g., a photopolymerizable material, the heating of the support film is in a line pattern, i.e., along the line at which the laminated edges of the two substrate elements abut or substantially abut one another. The line pattern can be by use of a wire element held in close proximity to the support and such wire spans the abutted laminated substrates. Another suitable design is a wedge wherein the narrow portion of the wedge directly faces the support.

The temperature and time of heating is not critical provided weakening of the support takes place. Lower heating rates can mean longer heating time to obtain similar results. An example of a sutiable heating time is a temeperature in the range 400° F. to 450° F. (230° to 261° C.) for a duration of at least about one second. Temperature is difficult to measure and can differ greatly from one polymer support material to another. Generally, polymer flow is required in the support which causes the weakening effect.

Generally the heating element will not touch the support. However with a proper coating material on the heating element, contact may take place, e.g., with use of a fluorocarbon release coating on the heater. Any heating source can be employed which can impart heat in a line pattern. Illustratively an infrared heating source could be employed provided its output is formed into a desired line pattern.

After weakening of the support, the initial laminated composite is pulled on its longitudinal axis along the direction of advancement of the substrate causing a breaking of both the photosensitive layer and the support film. Such pulling operation can be in the same manner disclosed by U.S. Pat. No. 4,378,264.

With the laminated substrates separated from one another process steps well known in the art can be undertaken including imaging such as with actinic radiation and etching or plating such as in making a circuit board in accordance with the teachings of U.S. Pat. No. 3,469,682.

To further illustrate the present invention the following example is provided.

EXAMPLE

A printed circuit board is laminated on one side with Vacrel® 8015 film with the coversheet removed (E. I. du Pont de Nemours and Company, Wilmington, Del.) in a Riston® Hot Roll Laminator HRL-24 (E. I. du Pont de Nemours and Company, Wilmington, Del.) at 100° C. The photopolymer composition film is supported by a Mylar® polyethylene terephthalate film. Another board of the same type is laminated after the first board such that the trailing edge of the first board is butted to the leading edge of the following board. After lamination, the butt seam is placed on the sealing platform of an Impulse Sealer TISH-300 [Taiwan Electric Heating Equipment Co. Ltd., Taiwan] 400 watts impulse power, 300 mm maximum seal length (i.e., hot wire length) with the heating power increased to 800 watts by overlapping an identical hot wire to the original, and the Impulse Sealer handle is manually pressed down to apply pressure along abutting edges of the substrate to ensure good contact with the wire. The amount of heat time is controlled by an adjustable internal electronic circuit. After heating, the handle is released and the boards are removed from the sealer. Then each board is gripped manually and pulled apart.

A clean break along the butt edge is obtained by regulating the heat time. An excessively long heat time will result in film damage at the break edges. In contrast, too short heat time does not allow the Mylar® polyethylene terephthalate to weaken sufficiently for the boards to be separated without use of a great deal of force.

Using the above procedures, different types of boards were tested and optimum heating times are tabulated below:

| Board Type # | Heat Time (second) |
| --- | --- |
| 1 | 1.1 |
| 2 | 1.1 |
| 3 | 0.8 |
| 4 | 1.1 |

All boards were 6 inches (wide)×12 inches (long)×0.062 inches (thick) with 0.003 inch thick copper laminated on both sides. Board #1 was a nonetched panel. Board #2 was an etched panel with about 0.25 inch copper border on the butted edge. Board #3 was an etched panel without copper, i.e., epoxy/glass only, on the butted edge. Board #4 was a similar type as #2 except that it had been placed with 0.0005 inch tin-lead over the copper surface.

What is claimed is:

1. A process for laminating a layer of a photosensitive composition which is supported by a stippable polymeric film to at least two substrate elements and separating the photosensitive layer and the polymeric film along an edge of each substrate element comprising the steps of:
   (a) advancing two substrate elements to a laminating position;
   (b) laminating a layer of a photosensitive composition supported by a strippable polymeric film onto a first substrate element and continuing the lamination onto a second substrate element whereby the sbustrate elements abut or substantially abut on another;
   (c) heating a localized area of the strippable film in a line pattern adjacent an edge of each of the substrate elements which abut or substantially abut one another whereby the heating serves to weaken the strippable polymeric film along the line pattern without substantially adversely affecting the photosensitive composition and whereby the localized heating results in a higher temperature in the area being heated then in adjacent portions of the film;
   (d) pulling on the first substrate element along its longitudinal axis in a direction of advancement of the substrate element to exceed the breaking strength of the laminated photosensitive layer and the weakened polymeric film to separate the first and second substrate elements.

2. The process of claim 1 wherein the laminating, heating and pulling is repeated on a series of substrates.

3. The process of claim 1 wherein the substrates abut one another.

4. The process of claim 1 wherein the strippable polymeric film is polyethylene terephthalate.

5. The process of claim 1 wherein in step (c) the heating of the localized area in a line pattern is by use of a wire element.

6. The process of claim 1 wherein in step (c) the heating of the localized area in a line pattern is by use of a wedge.

* * * * *